(12) United States Patent
Liu et al.

(10) Patent No.: US 8,348,470 B2
(45) Date of Patent: Jan. 8, 2013

(54) LED ILLUMINATING DEVICE

(75) Inventors: Tay-Jian Liu, Taipei Hsien (TW);
Tao-Ping Zhou, Shenzhen (CN); Ying Xiong, Shenzhen (CN)

(73) Assignees: Fu Zhun Precision Industry (Shen Zhen) Co., Ltd., Shenzhen (CN);
Foxconn Technology Co., Ltd., New Taipei (TW)

( * ) Notice: Subject to any disclaimer, the term of this patent is extended or adjusted under 35 U.S.C. 154(b) by 610 days.

(21) Appl. No.: 12/581,171

(22) Filed: Oct. 19, 2009

(65) Prior Publication Data

US 2011/0026251 A1 Feb. 3, 2011

(30) Foreign Application Priority Data

Jul. 28, 2009 (CN) .......................... 2009 1 0304907

(51) Int. Cl.
*F21V 29/00* (2006.01)
(52) U.S. Cl. ..................... 362/294; 362/373; 362/249.02
(58) Field of Classification Search .................. 362/294, 362/373, 249.02
See application file for complete search history.

(56) References Cited

U.S. PATENT DOCUMENTS

| | | | |
|---|---|---|---|
| 7,513,639 B2* | 4/2009 | Wang | 362/218 |
| 7,547,124 B2* | 6/2009 | Chang et al. | 362/373 |
| 7,674,011 B2* | 3/2010 | Zhou et al. | 362/249.02 |
| 7,753,568 B2* | 7/2010 | Hu et al. | 362/373 |
| 7,810,950 B2* | 10/2010 | Zhou et al. | 362/249.02 |
| 2008/0055908 A1* | 3/2008 | Wu et al. | 362/294 |
| 2009/0040760 A1* | 2/2009 | Chen et al. | 362/249 |

* cited by examiner

*Primary Examiner* — Anabel Ton
(74) *Attorney, Agent, or Firm* — Altis Law Group, Inc.

(57) ABSTRACT

An LED illuminating device includes a boiling room, an optical module, a heat insulating member and a heat exchanging member communicating with the boiling room. The boiling room defines a horizontal room and an annular, vertical room having a bottom end surrounding the horizontal room. A wick structure is received in the boiling room. Working fluid is received in the boiling room and saturated in a bottom portion of the wick structure. The optical module includes a plurality of LEDs attached to a heat absorbing member connecting with the bottom portion of the wick structure. The heat insulating member is received in the boiling room and attached to a middle portion of the wick structure for thermally insulating the middle portion of the wick structure from vaporized working fluid in the horizontal room of the boiling room.

20 Claims, 6 Drawing Sheets

LED ILLUMINATING DEVICE

BACKGROUND

1. Technical Field

The disclosure generally relates to light emitting diode (LED) illuminating devices, and particularly to an LED illuminating device with a high heat dissipating efficiency.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, while only ten percents to twenty percents of the power consumed by the LED is converted into light. In addition, a plurality of LEDs are generally packaged in a single LED illuminating device in order to obtain a desirable illumination brightness. Conventional heat dissipation devices, such as heat sinks made entirely of extruded aluminum blocks, can no longer satisfy the heat dissipation requirement of the high brightness LED illuminating device. Therefore, heat dissipation of the LED illuminating device is a problem inhibiting the application of the LED illuminating device, which requires to be resolved.

Therefore, it is desirable to provide an LED illuminating device with a high heat dissipating efficiency.

DETAILED DESCRIPTION

Figure 1:
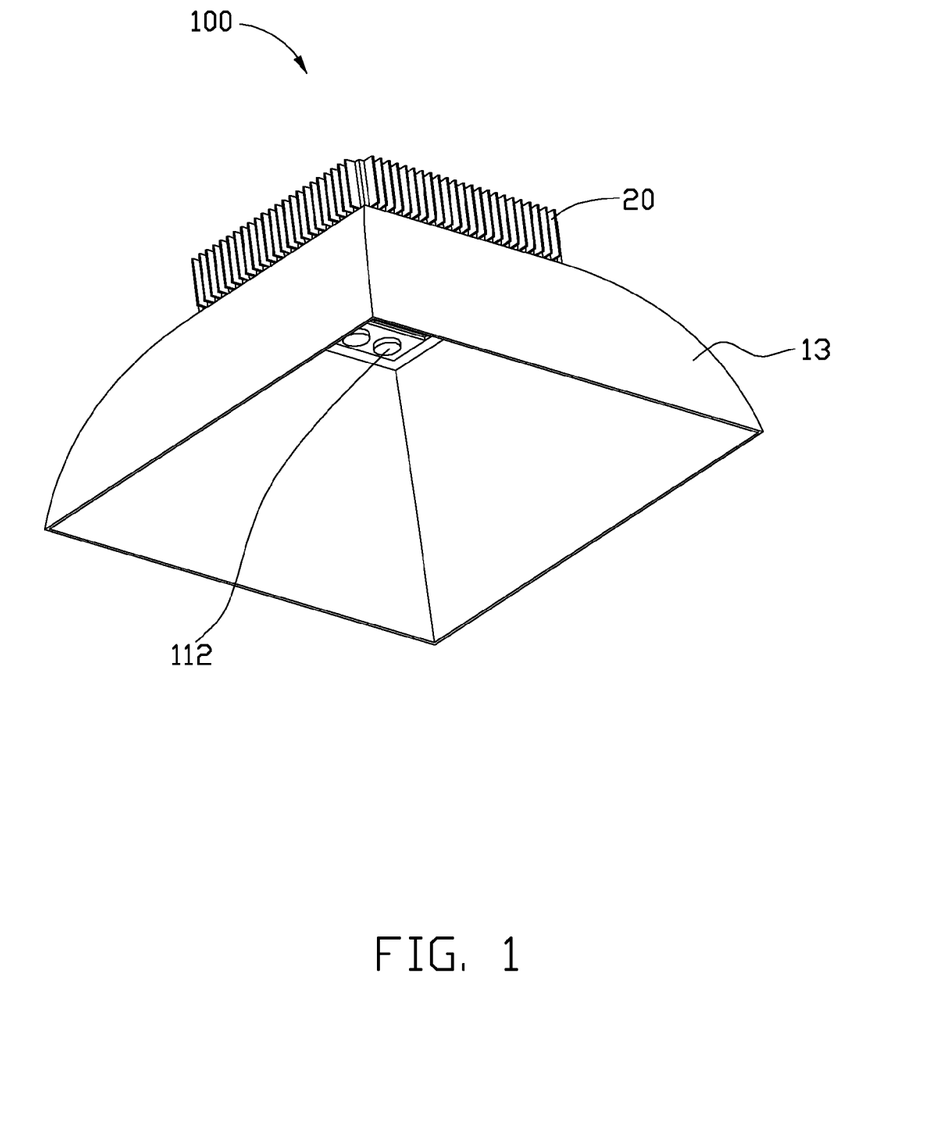
FIG. 1 is an isometric, assembled view of an LED illuminating device in accordance with an exemplary embodiment.
Figure 2:
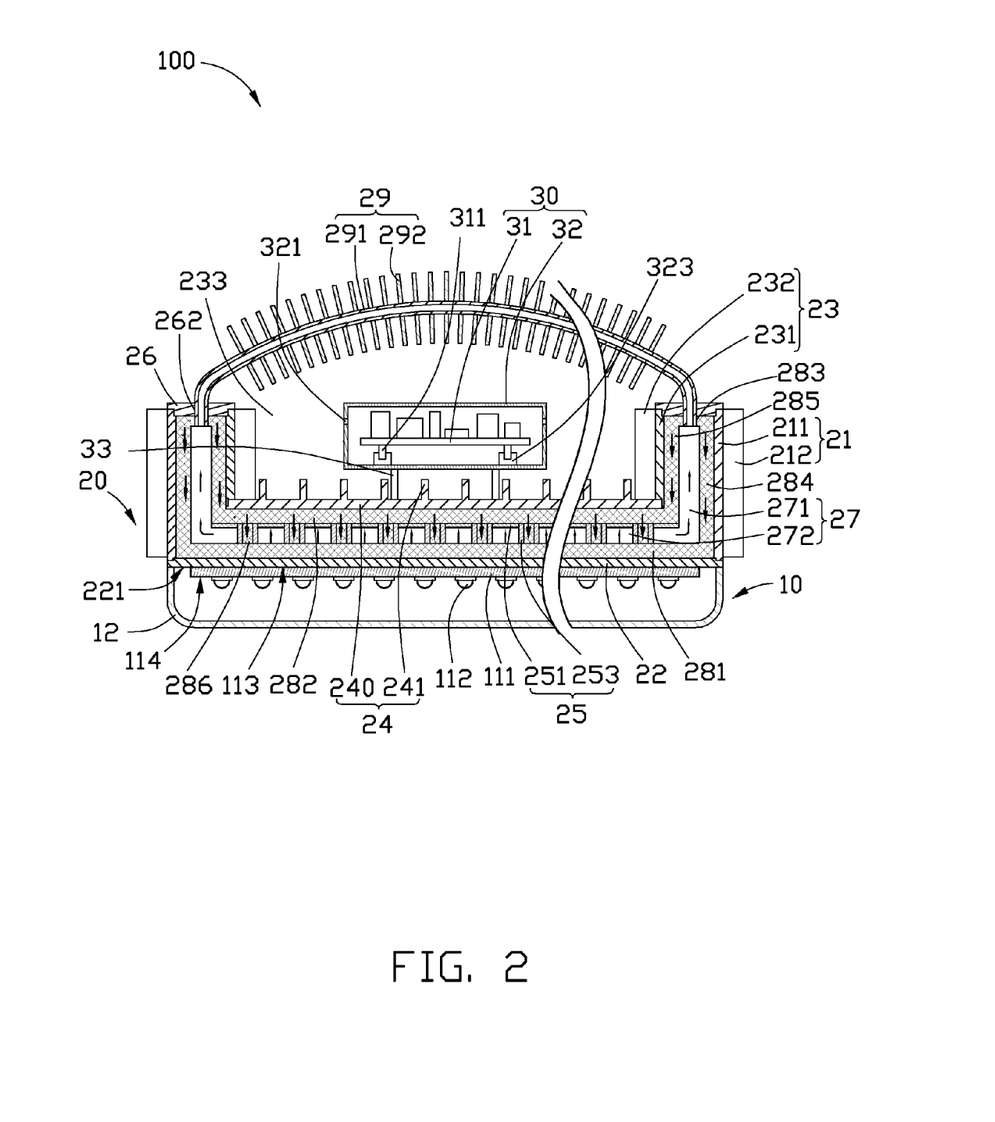
FIG. 2 is a cross sectional view of the LED illuminating device of FIG. 1, with a cover thereof being omitted.

Referring to FIGS. 1 and 2, an LED illuminating device 100 according to a first embodiment includes an optical module 10, a heat dissipation module 20, and an electric module 30.

The optical module 10 is arranged at a bottom side of the heat dissipation module 20. The optical module 10 includes a substrate 111, a plurality of LEDs 112, a lens 12, and a cover 13. The cover 13 is hollow. A top end of the cover 13 is connected to an outer periphery of the bottom side of the heat dissipation module 20. The cover 13 expands downwardly, and thus has a cross section gradually increased along a top-to-bottom direction. The substrate 111, the LEDs 112 and the lens 12 are received in the cover 13, and thus are prevented from being contaminated by dust. The substrate 111 is flat, and has a planar top surface 113 attached to the heat dissipation module 20 and an opposite planar bottom surface 114. The LEDs 112 are fixed on the bottom surface 114 of the substrate 111 with emitting sides of the LEDs 112 facing downwardly. The lens 12 is arranged under the LEDs 112 to provide required illumination characteristics for the light generated by the LEDs 112. Light emitted by the LEDs 112 is reflected and guided by the lens 12 to illuminate an outside.

For enhancing a heat conduction efficiency between the substrate 111 and the heat dissipation module 20, a layer of thermal interface material (TIM) can be applied between the top surface 113 of the substrate 111 and the bottom side of the heat dissipation module 20 to eliminate an air interstice therebetween. Alternatively, the top surface 113 of the substrate 111 can be attached to the bottom side of the heat dissipation module 20 fixedly and intimately through surface mount technology (SMT), whereby an interface between the substrate 111 and the heat dissipation module 20 can be eliminated and a thermal resistance between the LEDs 112 and the heat dissipation module 20 is much reduced. Thus heat generated by the LEDs 112 can be conducted to the heat dissipation module 20 via the substrate 111 and finally dissipated to the ambient atmosphere.

The electric module 30 is received in an upper portion of the heat dissipation module 20. The electric module 30 includes a casing 32 and a circuit board 31 received in the casing 32. The circuit board 31 is used for providing drive power, control signals and power management for the LEDs 112. Wires (not shown) extend from the circuit board 31 through the casing 32 to respectively connect to the LEDs 112 and an external power source; thus, electric current can be supplied to the LEDs 112 to cause the LEDs 112 to emit light.

A plurality of heat exchanging holes 321 extend through a side plate of the casing 32 adjacent to a top plate of the casing 32 for exchanging hot air in the casing 32 which is heated by the circuit board 31 and cool air out of the casing 32, whereby heat generated by the circuit board 31 can be dissipated to the outside. A plurality of connecting poles 33 extend downwardly from a bottom plate of the casing 32 to connect with the heat dissipation module 20, thus to fix the electric module 30 onto the heat dissipation module 20. A plurality of supporting poles 323 extend upwardly from the bottom plate of the casing 32, and a plurality of positioning poles 311 extend downwardly from the circuit board 31 to respectively connect with the supporting poles 323 on the bottom plate of the casing 32. Thus, the circuit board 31 is fixed in the casing 32 and supported by the supporting poles 323.

Figure 3:
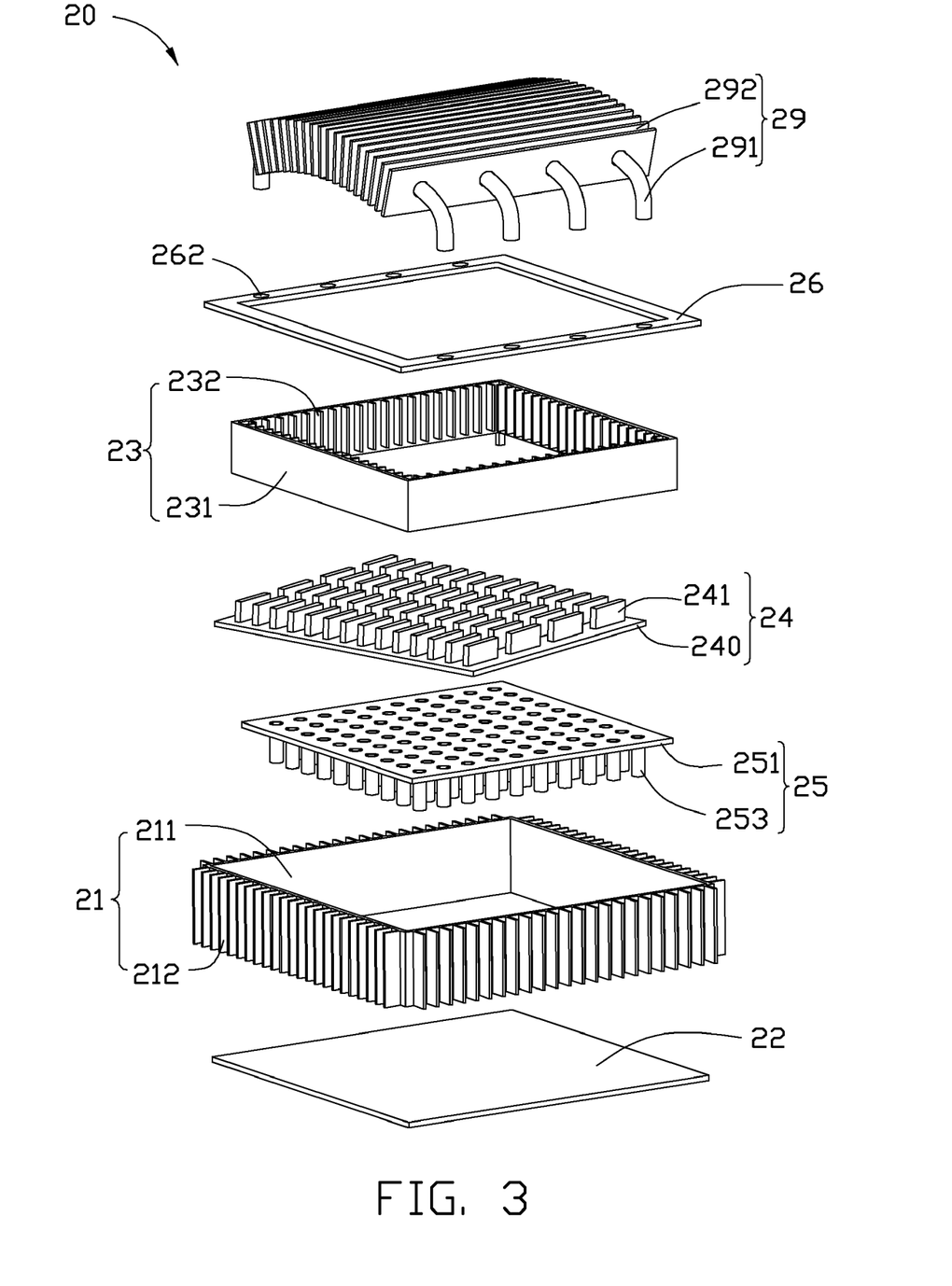
FIG. 3 is an isometric, exploded view of a heat dissipation module of the LED illuminating device of FIG. 1.

Referring to FIG. 3, the heat dissipation module 20 includes a heat absorbing member 22, an outer heat sink 21, an inner heat sink 23, a heat dissipating member 24, a sealing plate 26, a heat exchanging member 29, a wick structure and a heat insulating member 25. The inner heat sink 23, the outer heat sink 21, the heat absorbing member 22, the heat dissipating member 24, the sealing plate 26, and the heat exchanging member 29 each are formed of a metal with good heat conductivity such as aluminum, copper or an alloy thereof. In this embodiment, the inner heat sink 23, the outer heat sink 21, the heat absorbing member 22, the heat dissipating member 24, the sealing plate 26, and the heat exchanging member 29 are individually formed and then connected together. In fact, two or more of these elements can be integrally formed, to thereby omit an assembly process of these individual elements.

In this embodiment, the heat absorbing member 22 is a rectangular sheet. The heat absorbing member 22 is arranged on the substrate 111 of the optical module 10 with a bottom surface 221 thereof attached to the top surface 113 of the substrate 111 closely. A size of the heat absorbing member 22 is larger than that of the substrate 111, and thus an outer periphery of the bottom surface 221 of the heat absorbing member 22 is exposed for assembling the cover 13 and the lens 12 thereon.

The outer heat sink 21 is hollow, and includes an outer tube 211 and a plurality of outer fins 212 extending outwardly from an outer surface of the outer tube 211. The outer fins 212 are spaced from each other. The outer tube 211 is rectangular. An outer size of the outer tube 211 substantially equals to that of the heat absorbing member 22.

The inner heat sink 23 includes an inner tube 231 and a plurality of inner fins 232. The inner tube 231 has a profile similar to that of the outer tube 211, being a hollow rectangle. A height of the inner tube 231 is smaller than that of the outer tube 211. An outer size of the inner tube 231 is smaller than an inner size of the outer tube 211. The inner fins 232 extend inwardly from an inner surface of the inner tube 231. Free ends of the inner fins 232 are spaced from each other a distance. A space 233 is thus defined among the free ends of the inner fins 232 for receiving the electric module 30 therein.

The sealing plate 26 is rectangular and hollow. An outer size of the sealing plate 26 substantially equals to that of the outer tube 211 of the outer heat sink 21, while an inner size of the sealing plate 26 substantially equals to that of the inner tube 231 of the inner heat sink 23. A plurality of apertures 262 are defined in two opposite sides of the sealing plate 26. In this embodiment, there are four apertures 262 in each of the two opposite sides of the sealing plate 26.

The heat dissipating member 24 includes a base 240 and a plurality of heat dissipating fins 241 on the base 240. The base 240 is rectangular and flat. An outer size of the base 240 substantially equals to that of the inner tube 231 of the inner heat sink 23. The heat dissipating fins 241 extend upwardly and integrally from a top surface of the base 240.

The heat exchanging member 29 includes a plurality of heat exchanging pipes 291, and a plurality of heat exchanging fins 292. In this embodiment, there are four heat exchanging pipes 291, and each heat exchanging pipe 291 has a plurality of heat exchanging fins 292 mounted therearound. The heat exchanging pipes 291 each are substantially arced, with two ends thereof bent downwardly and engaging into corresponding two of the apertures 262 of the sealing plate 26. It is to be understood that the apertures 262 of the sealing plate 26 are used for receiving the heat exchanging pipes 291, and the number, the shape, the position of the apertures 262 are defined according to the heat exchanging pipes 291 of the heat exchanging member 29, and should be changed when the heat exchanging pipes 291 are modified.

When assembled, the inner heat sink 23 is coaxially received in the outer heat sink 21. The top end of the inner heat sink 23 is at the same level as the top end of the outer tube 211, while the bottom end of the inner tube 231 is higher than the bottom end of the outer tube 211. Since the outer size of the inner tube 231 is smaller than the inner size of the outer tube 211, an annular, vertical room 271 is defined between the inner tube 231 of the inner heat sink 23 and the outer tube 211 of the outer heat sink 21. The sealing plate 26 is arranged on the top ends of the inner tube 231 and the outer tube 211. The heat exchanging pipes 291 of the heat exchanging member 29 respectively extend through the apertures 262 of the sealing plate 26 into the annular, vertical room 271 of the boiling room 27. Each heat exchanging pipe 291 has an inner space communicating with the annular, vertical room 271.

The heat absorbing member 22 couples to and hermetically seals the bottom end of the outer tube 211. The heat dissipating member 24 is arranged at and hermetically seals the bottom end of the inner tube 231. The heat dissipating fins 241 of the heat dissipating member 24 extend into the space 233 among the inner fins 232 of the inner heat sink 23. The electric module 30 received in the space 233 has the casing 32 thereof located over the heat dissipating fins 241 and the connecting poles 33 thereof extending through interspace among the heat dissipating fins 241 to be fixed on the top surface of the base 240 of the heat dissipating member 24.

Since the bottom end of the inner tube 231 is higher than the bottom end of the outer tube 211, the heat dissipating member 24 spaces from the heat absorbing member 22 a distance, and thus a horizontal room 272 is defined between the base 240 of the heat dissipating member 24 and the heat absorbing member 22. The horizontal room 272 is surrounded by the annular, vertical room 271, and communicates a bottom end of the annular, vertical room 271. Cooperatively, the inner tube 231 of the inner heat sink 23, the outer tube 211 of the outer heat sink 21, the sealing plate 26, the heat exchanging pipes 291 of the heat exchanging member 29, the heat absorbing member 22, and the base 240 of the heat dissipating member 24 form a sealed boiling room 27 consisting of the annular, vertical room 271 and the horizontal room 272. Before the boiling room 27 is sealed, the wick structure is formed in the boiling room 27. Then the boiling room 27 is vacuumed and a working fluid such as water, alcohol, methanol, or the like, is injected into the boiling room 27.

In this embodiment, the wick structure is screen mesh. Alternatively, the wick structure can be sintered powder, fiber, metal foam, and tiny grooves. The wick structure includes a bottom portion 281 spread on the a top surface of the heat absorbing member 22, a top portion 283 spread on a bottom surface of the sealing plate 26, a middle portion 282 spread on a bottom surface of the base 240 of the heat dissipating member 24, an inner portion 285 spread on the outer surface of the inner tube 231, an outer portion 284 spread on the inner surface of the outer tube 211, and a plurality of connecting portions 286 equidistantly arranged between the bottom portion 281 and the middle portion 282 and interconnecting the bottom portion 281 and the middle portion 282. The working fluid injected in the boiling room 27 is saturated in the wick structure, particularly in the bottom portion 281 of the wick structure.

The inner portion 285 and the outer portion 284 of the wick structure are vertical. The outer portion 284 surrounds and spaces a distance from the inner portion 285. The bottom portion 281, the middle portion 282 and the top portion 283 of the wick structure each are horizontal, and parallel to each other. The top portion 283 interconnects top ends of the inner portion 285 and the outer portion 284. An outer periphery of the middle portion 282 connects a bottom end of the inner portion 285. An outer periphery of the bottom portion 281 connects a bottom end of the outer portion 284. On the other hand, the outer portion 284 interconnects an outer periphery of the top portion 283 and the outer periphery of the bottom portion 281, while the inner portion 285 interconnects an inner periphery of the top portion 283 and the outer periphery of the middle portion 282.

The heat insulating member 25 is received in the horizontal room 272 of the boiling room 27, and arranged between the middle portion 282 and the bottom portion 281 of the wick structure. The heat insulating member 25 includes an adiabatic plate 251 and a plurality of cylinders 253 extending downwardly from the adiabatic plate 251. The cylinders 253 are substantially evenly distributed on the adiabatic plate 251. A top surface of the adiabatic plate 251 abuts a bottom side of the middle portion 282 of the wick structure, and bottom ends of the cylinders 253 abut a top side of the bottom portion 281 of the wick structure. The connecting portions 286 of the wick structure are respectively received in the cylinders 253 of the heat insulating member 25. Top and bottom ends of each connecting portion 286 of the wick structure are respectively attached the middle portion 282 and the bottom portion 281 of the wick structure.

In operation, heat generated by the LEDs 112 is conducted to the substrate 111 and then to the heat absorbing member 22. The heat of the LEDs 112 is then rapidly transferred from the heat absorbing member 22 to the working fluid in the boiling room 27. The working fluid boils immediately and vaporizes into vapor. For the adiabatic plate 251 of the heat insulating member 25 arranged at the bottom side of the middle portion 282 of the wick structure, the middle portion 282 of the wick structure and the heat dissipating member 24 on the adiabatic plate 251 are substantially thermally insulated and physically isolated from the vapor. In addition, the cylinders 253 of the heat insulating member 25 thermally insulate the connecting portions 286 of the wick structure received therein from the vapor. In other words, most of the heat carried by the vapor is prevented from being transferred to the heat dissipating member 24, the middle portion 282 and the connecting portions 286 of the wick structure. Thus the vapor accumulates in the horizontal room 272 and then flows upwardly to the annular, vertical room 271 of the boiling room 27, as indicated by arrows in FIG. 2.

When the vapor goes up into the annular, vertical room 271 of the boiling room 27, since the heat exchanging pipes 291 communicate the annular, vertical room 271, part of the vapor flows into the heat exchanging pipes 291 and releases the heat carried thereby to the heat exchanging fins 292 around the heat exchanging pipes 291. Finally the heat exchanging fins 292 dissipate the heat to the ambient atmosphere. In addition, part of the heat carried by the vapor is released to the outer tube 211 of the outer heat sink 21, and then dissipated to the ambient atmosphere by the outer fins 212 of the outer heat sink 21. Simultaneously, part of the heat carried by the vapor is released to the inner tube 231 of the inner heat sink 23, and then dissipated to the ambient atmosphere by the inner fins 232 of the inner heat sink 23.

After the vapor releases the heat, the vapor is condensed into liquid. Part of the condensed liquid is absorbed by the outer portion 284 of the wick structure arranged on the outer heat sink 21 and then directly drawn back to the bottom portion 281 of the wick structure via capillary force of the outer portion 284. Simultaneously, part of the condensed liquid is absorbed by the inner portion 285 of the wick structure arranged on the inner heat sink 23. The condensed liquid in the inner portion 285 of the wick structure is firstly drawn back to the middle portion 282 of the wick structure by the capillary force of the middle portion 282, and then drawn back to the bottom portion 281 of the wick structure by the capillary force provided by the connecting portions 286. The liquid returned back to the bottom portion 281 of the wick structure is available for a next phase change cycle, whereby the heat of the LEDs 112 is continuously and effectively removed by the heat dissipation module 20.

In the present LED illuminating device 100, when the condensed liquid flows across the middle portion 282 to the connecting portions 286, the base 240 of the heat dissipating member 24 on the middle portion 282 can absorb heat from the condensed liquid and then transfer the heat to the heat dissipating fins 241 on the base 240. Thus the condensed liquid can be further cooled when flows across the middle portion 282 of the wick structure. Finally the cooled liquid drawn back to the bottom portion 281 of the wick structure via the middle portion 282 and the connecting portions 286 has a relatively lower temperature and can take away more heat from the LEDs 112.

Further, in the present LED illuminating device 100, the vapor flows from the horizontal room 272 to the annular, vertical room 271 to dissipate heat, while the liquid flows back along the wick structure. In other words, the vapor and the liquid flow along different passages in the boiling room 27. In addition, as stated above, the middle portion 282 and the connecting portions 286 of the wick structure are thermally insulated from the vapor, and thus the condensed liquid flowing across the middle portion 282 and the connecting portions 286 of the wick structure does not exchange heat with the vapor in the horizontal room 272 of the boiling room 27. Thus both thermal and flow interactions between the vapor and the liquid of the present LED illuminating device 100 are significantly avoided. Flow resistances of both of the vapor and liquid are lowered; thus the vapor can timely take away the heat of the LEDs 112, while the liquid can timely flow back to begin a new cycle. Accordingly, the heat dissipation module 20 can take away the heat of the LEDs 112 more efficiently.

Figure 4:
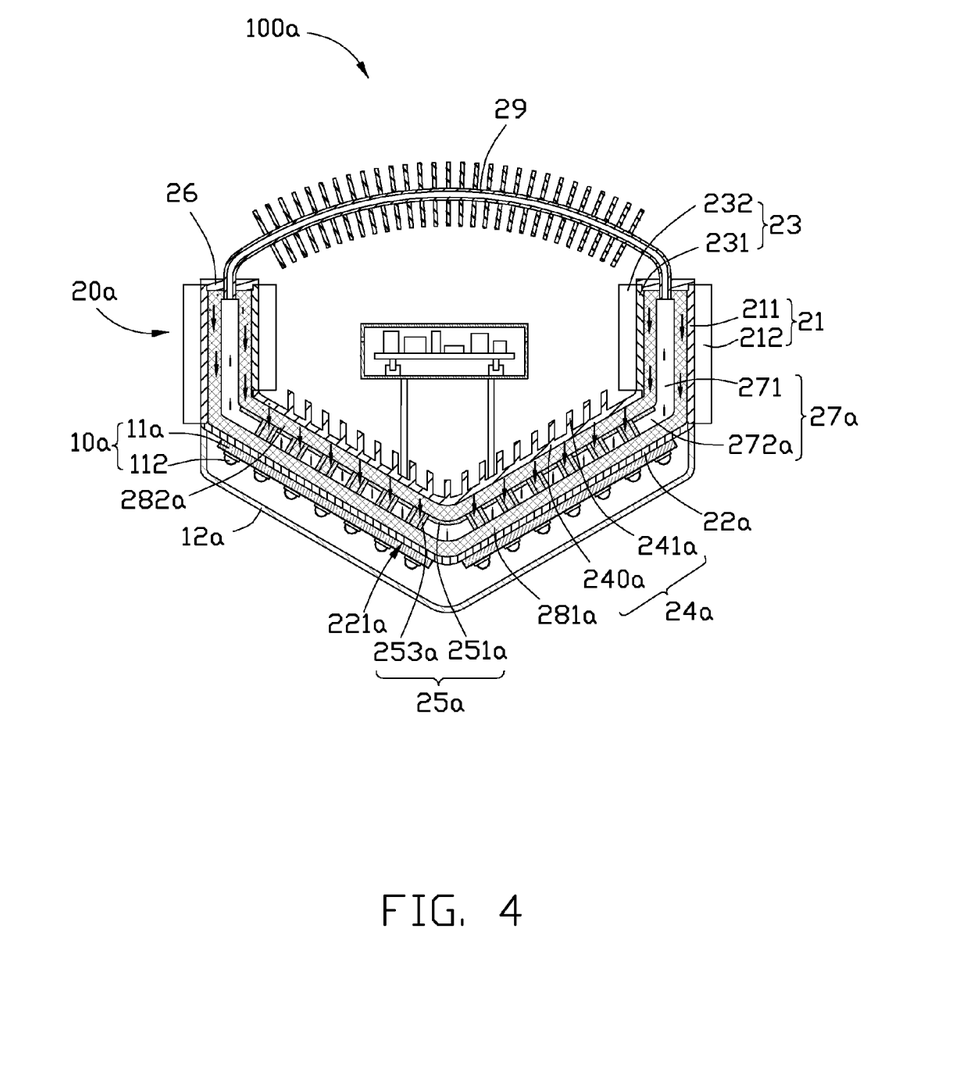
FIG. 4 is a cross sectional view of an LED illuminating device according to a second embodiment.

FIG. 4 shows an LED illuminating device 100a according to a second embodiment. In this embodiment, the LED illuminating device 100a includes a heat dissipation module 20a and an optical module 10a different from the first embodiment. In this embodiment, the heat dissipation module 20a includes a heat absorbing member 22a, a heat dissipating member 24a, an outer heat sink 21 extending upwardly from an outer, top end of the heat absorbing member 22a, an inner heat sink 23 extending upwardly from an outer, top end of the heat dissipating member 24a, a sealing plate 26 arranged on top ends of the inner and outer heat sinks 21, 23, and a heat exchanging member 29. The heat absorbing member 22a is generally V-shaped in cross section. In perspective, the heat absorbing member 22a has a configuration of an inverted hollow square pyramid. The heat dissipating member 24a includes a base 240a arranged above and parallel to the heat absorbing member 22a and a plurality of heat dissipating fins 241a extending vertically and upwardly from the base 240a. Like the heat absorbing member 22a, the base 240a has a V-like shape in cross section and a configuration of an inverted hollow square pyramid in perspective.

An annular, inclined room 272a, which is V-shaped in cross section, is defined between the heat absorbing member 22a and the heat dissipating member 24a. An annular, vertical room 271 is defined between the inner and outer heat sinks 21, 23. The annular, inclined room 272a and the annular, vertical room 271 cooperatively form a boiling room 27a for receiving a wick structure and working fluid therein. The heat exchanging member 29 communicates the boiling room 27a. The wick structure includes a middle portion 282a, which is V-shaped in cross section and attached to a bottom surface of the base 240a, and a bottom portion 281a, which is V-shaped in cross section and attached to a top surface of the heat absorbing member 22a. A heat insulating member 25a is arranged between the middle portion 282a and the bottom portion 281a of the wick structure. The heat insulating member 25a has an adiabatic plate 251a, which is generally V-shaped in cross section and attached to a bottom of the middle portion 282a of the wick structure, and a plurality of cylinders 253a extending perpendicularly from the adiabatic plate 251a to the bottom portion 281a of the wick structure.

The optical module 10a is arranged under the heat dissipation module 20a, and includes a substrate 11a attached to a bottom surface of the heat absorbing member 22a, a plurality of LEDs 112 fixed on the substrate 11a, and a lens 12a under the LEDs 112. The substrate 11a has a profile similar to the heat absorbing member 22a, being V-shaped in cross section. Thus the substrate 11a can be fixedly and intimately attached to the heat absorbing member 22a of the heat dissipation module 20a to enhance a heat conduction therebetween. Similarly, the lens 12a is V-shaped in cross section. It is to be understood that since the heat absorbing member 22a is for absorbing heat of the LEDs 112, the shape of the heat absorbing member 22a should match the shape of the substrate 11a. When the shape of the substrate 11a is changed, the shape of the heat absorbing member 22a should be changed as well.

Figure 5:
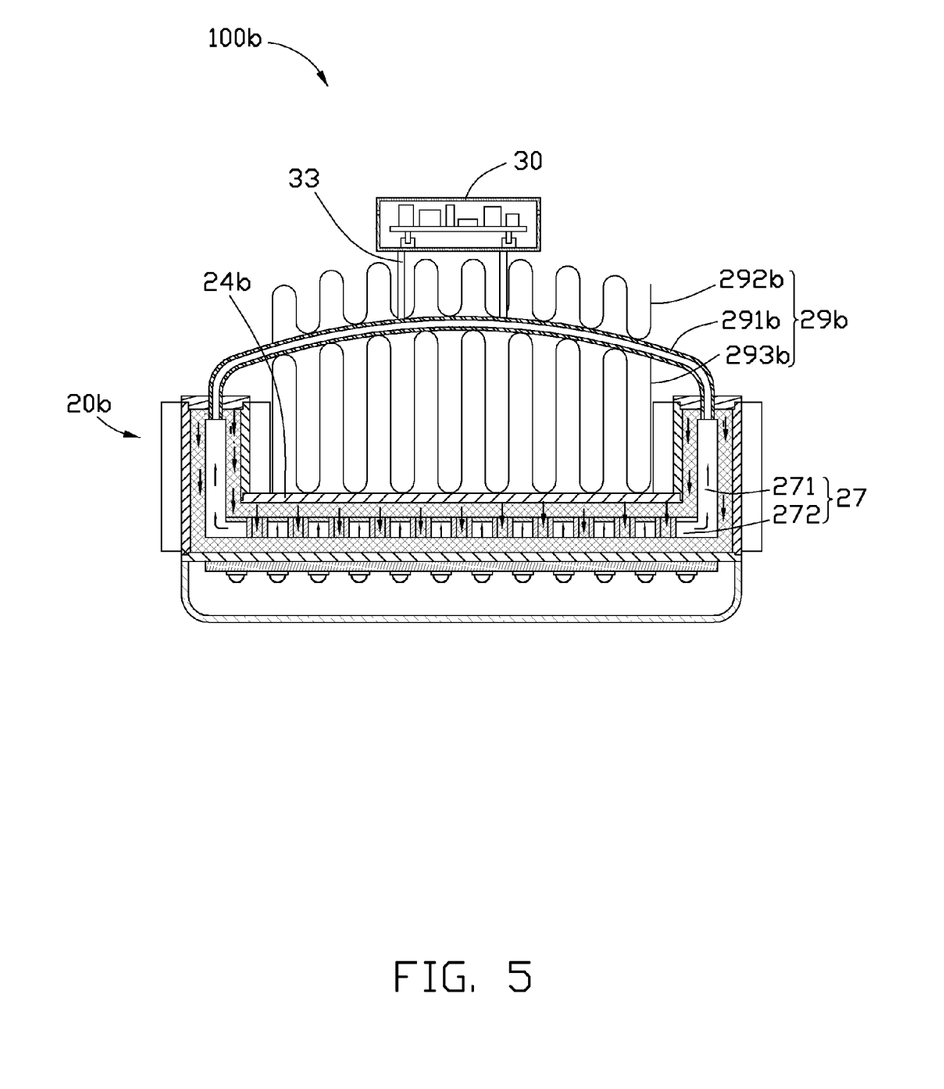
FIG. 5 is a cross sectional view of an LED illuminating device according to a third embodiment.
Figure 6:
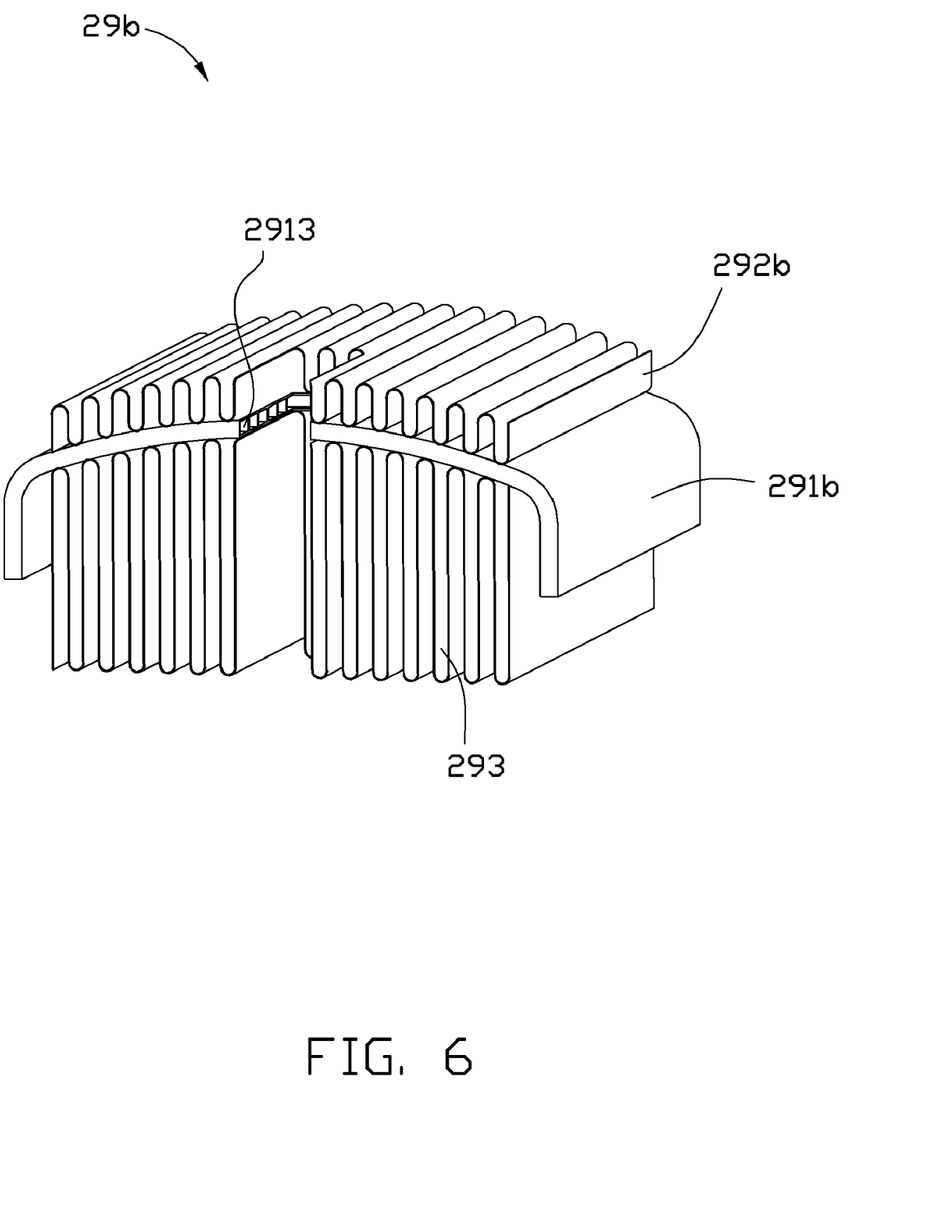
FIG. 6 shows a heat exchanging member of the LED illuminating device of FIG. 5, with a part thereof being cut away.

FIGS. 5-6 show an LED illuminating device 100b according to a third embodiment. The difference between this embodiment and the first embodiment is only in the heat dissipating member 24b and the heat exchanging member 29b of the heat dissipation module 20b. In this embodiment, the heat exchanging member 29b includes a heat exchanging pipe 291b, an upper heat exchanging fin 292b, and a lower heat exchanging fin 293b. The heat exchanging pipe 291b is flat, elongated and arced. A plurality of flow channels 2913 are defined in the heat exchanging pipe 291b communicating a top end of an annular, vertical room 271 of a boiling room 27 of the heat dissipation module 20b. The boiling room 27 has a horizontal room 272 located within and communicating with a bottom end of the annular, vertical room 271. The upper heat exchanging fin 292b is fixed on a top side of the heat exchanging pipe 291b, while the lower heat exchanging fin 293b is fixed on a bottom side of the heat exchanging pipe 291b. Each of the lower heat exchanging fin 293b and the upper heat exchanging fin 292b is formed by folding a metal sheet into a corrugated configuration. The heat dissipating member 24b is a flat board. The lower heat exchanging fin 293b extends downwardly from the heat exchanging pipe 291b to contact the heat dissipating member 24b intimately. Thus heat absorbed by the heat dissipating member 24b can be conducted to the lower heat exchanging fin 293b for dissipation. An electric module 30 of the LED illuminating device 100b is fixed on the heat exchanging pipe 291b with connecting poles 33 thereof fixed on the top side of the heat exchanging pipe 291b.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED illuminating device, comprising:
   a heat management room defined among an outer tube, an inner tube coaxially received in the outer tube, a heat absorbing member coupling to and sealing a bottom end of the outer tube, a base coupling to and sealing a bottom end of the inner tube, and a sealing plate arranged on top ends of the outer tube and the inner tube, the heat management room comprising a lower room being defined between the base and the heat absorbing member, and an upper room being defined between the inner tube and the outer tube, a bottom end of the upper room communicating with the lower room;
   working fluid filled in the lower room of the heat management room;
   a heat exchanging member comprising at least one heat exchanging pipe extending through the sealing plate into the upper room of the heat management room, an inner space of the at least one heat exchanging pipe communicating with the upper room of the heat management room and a plurality of heat exchanging fins arranged around the at least one heat exchanging pipe;
   an optical module comprising a substrate attached to the heat absorbing member and a plurality of LEDs fixed on the substrate;
   an electrical module being electrically connected with the LEDs; and
   a heat insulating member being received in the heat management room and attached to the base to thermally insulate the base from vaporized working fluid in the lower room of the heat management room.

2. The LED illuminating device of claim 1, wherein the heat insulating member comprises an adiabatic plate attached to the base and a plurality of cylinders extending downwardly from the adiabatic plate towards the heat absorbing member.

3. The LED illuminating device of claim 2, further comprising a wick structure arranged in the heat management room, the wick structure comprising a bottom portion arranged between the heat absorbing member and the cylinders, a middle portion between the adiabatic plate and the base, and a plurality of connecting portions respectively extending through the cylinders to interconnect the bottom portion and the middle portion of the wick structure.

4. The LED illuminating device of claim 3, wherein the wick structure further comprises an inner portion spread on the inner tube with a bottom end thereof connected to an outer periphery of the middle portion, and an outer portion spread on the outer tube with a bottom end thereof connected to an outer periphery of the bottom portion, a plurality of inner fins extending inwardly from an inner surface of the inner tube, and a plurality of outer fins extending outwardly from an outer surface of the outer tube.

5. The LED illuminating device of claim 4, wherein the wick structure further comprises a top portion spread on the sealing plate and interconnecting top ends of the inner portion and the outer portion of the wick structure.

6. The LED illuminating device of claim 4, wherein a space is defined among the inner fins and receives the electric module therein, the electrical module comprising a casing and a circuit board received in the casing and electrically connected with the LEDs, a plurality of air passage holes being provided through a circumferential periphery of the casing, a plurality of connecting poles extending downwardly from the casing and fixed to the base to fix the electric module on the base.

7. The LED illuminating device of claim 1, further comprising a plurality of heat dissipating fins extending integrally and upwardly from the base.

8. The LED illuminating device of claim 1, wherein the at least one heat exchanging pipe is flat and elongated, the plurality of heat exchanging fins being formed on top and bottom sides of the at least one heat exchanging pipe, the heat exchanging fins at the bottom side of the at least one heat exchanging pipe being attached the base intimately.

9. The LED illuminating device of claim 8, wherein a plurality of flow channels are defined in the inner space of the at least one heat exchanging pipe and communicates with the upper room of the heat management room.

10. The LED illuminating device of claim 1, wherein the heat absorbing member, the base, the substrate each are V-shaped in cross section.

11. The LED illuminating device of claim 1, wherein the heat absorbing member, the base, the substrate each are planar, the bottom end of the inner tube being higher than the bottom end of the outer tube.

12. An LED illuminating device, comprising:
    a heat management room defining a lower room and an annular, upper room surrounding the lower room;

a heat exchanging member comprising at least one heat exchanging pipe extending into a top of the heat management room to communicate with the upper room and a plurality of heat exchanging fins arranged around the at least one heat exchanging pipe;

a wick structure received in the heat management room;

working fluid received in the heat management room and saturated in a bottom portion of the wick structure located at a bottom of lower room;

an optical module being provided with a plurality of LEDs attached to a heat absorbing member connecting with the bottom portion of the wick structure; and a heat insulating member being received in the heat management room and attached to a middle portion of the wick structure at a top of the lower room for thermally insulating the middle portion of the wick structure from vaporized working fluid in the lower room of the heat management room.

13. The LED illuminating device of claim 12, wherein the heat management room is defined among an outer tube, an inner tube coaxially received in the outer tube, a heat absorbing member coupling to and sealing a bottom end of the outer tube, a base coupling to and sealing a bottom end of the inner tube, and a sealing plate between a top end of the outer tube and a top end of the inner tube, the lower room being defined between the base and the heat absorbing member, the annular, upper room being defined between the inner tube and the outer tube surrounding the lower room, the middle portion of the wick structure being attached to a bottom of the base, the bottom portion of the wick structure being arranged on a top of the heat absorbing member, the at least one heat exchanging pipe extending through the sealing plate.

14. The LED illuminating device of claim 12, wherein the heat absorbing member, the base, the substrate each are V-shaped in cross section.

15. The LED illuminating device of claim 12, wherein the heat absorbing member, the base, the substrate each are planar, the bottom end of the inner tube being higher than the bottom end of the outer tube.

16. The LED illuminating device of claim 12, wherein the at least one heat exchanging pipe is arced and elongated, the heat exchanging fins being formed on top and bottom sides of the heat exchanging pipe, the heat exchanging fins at the bottom side of the at least one heat exchanging pipe being attached the base intimately.

17. The LED illuminating device of claim 16, wherein a plurality of flow channels is defined in the heat exchanging pipe and communicates with the upper room of the heat management room.

18. The LED illuminating device of claim 13, wherein the wick structure further comprises an inner portion spread on the inner tube with a bottom end thereof connected to an outer periphery of the middle portion, and an outer portion spread on the outer tube with a bottom end thereof connected to an outer periphery of the bottom portion, and a plurality of connecting portions interconnecting the bottom portion and the middle portion.

19. The LED illuminating device of claim 18, wherein the heat insulating member comprises an adiabatic plate attached to the middle portion of the wick structure and a plurality of cylinders extending downwardly from the adiabatic plate to the bottom portion of the wick structure, the connecting portions of the wick structure being respectively received in the cylinders of the heat insulating member.

20. The LED illuminating device of claim 18, further comprising a plurality of outer fins extending outwardly from an outer surface of the outer tube, and a plurality of inner fins extending inwardly from an inner surface of the inner tube.

* * * * *